US012603652B1

(12) United States Patent　　(10) Patent No.:　US 12,603,652 B1

White et al.　　(45) Date of Patent:　Apr. 14, 2026

(54) SCALABLE ARCHITECTURE FOR SYNCHRONIZED ARBITRARY WAVEFORMS

(71) Applicant: HRL LABORATORIES, LLC, Malibu, CA (US)

(72) Inventors: Randall White, Malibu, CA (US); Donald A. Hitko, Malibu, CA (US); Daniel S. Matic, Malibu, CA (US); Bradley Greene, Malibu, CA (US); David Matthews, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 230 days.

(21) Appl. No.: 18/517,089

(22) Filed: Nov. 22, 2023

(51) Int. Cl.
　　 *H03L 7/00*　　　(2006.01)
　　 *H03K 3/01*　　　(2006.01)
　　 *H03K 17/56*　　 (2006.01)
(52) U.S. Cl.
　　 CPC ................. *H03L 7/00* (2013.01); *H03K 3/01* (2013.01); *H03K 17/56* (2013.01)

(58) Field of Classification Search
　　 CPC ................... H03K 5/135; H03K 5/131; H03K 2005/00058; H03K 2005/00019; H03K 2005/00013; H03K 5/00; H03K 5/13
　　 See application file for complete search history.

(56) References Cited

U.S. PATENT DOCUMENTS 8,970,421 B1 *　3/2015　Gao ...................... G04F 10/005
　　　　　　　　　　　　　　　　　341/166
9,755,872 B1 *　9/2017　Tertinek ................. H03K 19/21

* cited by examiner

*Primary Examiner* — Diana J. Cheng
(74) *Attorney, Agent, or Firm* — Lewis Roca Rothgerber Christie LLP

(57)　　　　　　　ABSTRACT

Embodiments relate to a waveform processing device. The device can include a first input node configured to receive a first signal and a second input node configured to receive a second signal. The device can include a pulse generator including a self-timed digital converter (DTC) with a clock generator (CLK). The device can include a switching network configured to be driven by an output from the pulse generator to modulate the first signal and the second signal in synchronization.

20 Claims, 5 Drawing Sheets

100

100

SCALABLE ARCHITECTURE FOR SYNCHRONIZED ARBITRARY WAVEFORMS

STATEMENT REGARDING FEDERALLY SPONSORED RESEARCH OR DEVELOPMENT

This invention was made with Government support. The Government has certain rights in this invention.

FIELD

Embodiments relate to devices and methods for modulating signals to synchronize waveforms.

BACKGROUND INFORMATION

Existing implementations generally consist of a digital controller, waveform memory, and a digital to analog controller (DAC). The voltage precision of such a system is described by the effective number of bits (ENOB) of the DAC, while the timing precision is inversely proportional to the clock frequency of the system. It is challenging to simultaneously achieve a high voltage and timing precision, as the ENOB of existing DAC circuits generally degrades as the clock frequency increases. Furthermore, the power dissipation of the digital controller and waveform memory become severe due to the high operating frequency. The memory requirement is also high because the memory depth is generally set by an application-defined time period multiplied by the frequency of operation. When the operating frequency is high, a correspondingly high memory depth is required. The consequence of these factors is that existing implementations are limited in performance and scale for multi-channel applications requiring high precision in both voltage and timing.

Existing implementations can be appreciated from Tektronix AWG70001 or Keysight M8195A. The AWG70001 employs two interleaved 25 Gsps DACs to produce an aggregate sampling rate of 50 Gsps. With this instrument, the timing resolution is at best $\frac{1}{50}$ Gsps, or 20 ps. The instrument is specified for an ENOB of 4.6b over a 20 GHz bandwidth. This instrument provides two output channels, and up to four instruments can be synchronized. Each instrument is powered by a 500 W power supply. The M8195A samples at up to 65 Gsps with a 4.5b ENOB over an analog bandwidth of 25 GHz. Each instrument provides up to 4 channels, and has a wall-plug power specification of 180 W. Up to four instruments can be linked to provide 16 synchronized channels These systems are limited in timing and voltage precision, and do not support a high number of channels. They also have high power dissipation per channel.

SUMMARY

Embodiments can relate to waveform processing device. The device can include a first input node configured to receive a first signal and a second input node configured to receive a second signal. The device can include a pulse generator including a self-timed digital converter (DTC) with a clock generator (CLK). The device can include a switching network configured to be driven by an output from the pulse generator to modulate the first signal and the second signal in synchronization.

Embodiments can relate to a waveform processing device. The device can include a first input node configured to receive a first signal, wherein the first input node includes a first digital to analog converter (DAC) configured to generate a voltage $V_1$ based on the first signal. The device can include a second input node configured to receive a second signal, wherein the second input node includes a second DAC configured to generate a voltage $V_2$ based on the second signal. The device can include a pulse generator including a self-timed digital time converter (DTC) with a clock generator (CLK) and a reset/set (R/S) latch. The device can include a switching network including a switch driver, a first switch connected to an output of the DAC of the first waveform input node, and a second switch connected to an output of the DAC of the second waveform input node, wherein the switching network is configured to be driven by an output from the pulse generator to modulate the first signal and the second signal in synchronization.

Embodiments can relate to a method for synchronizing waveforms. The method can involve receiving plural signals at a first input node and a second input node a waveform processing circuit, the waveform processing circuit including: a pulse generator with a self-timed digital time converter (DTC) with a clock generator (CLK); and a switching network connected to the pulse generator. The method can involve driving the switching network by an output of the pulse generator to modulate signals received by the waveform processing circuit in synchronization.

BRIEF DESCRIPTION OF THE DRAWINGS

Other features and advantages of the present disclosure will become more apparent upon reading the following detailed description in conjunction with the accompanying drawings, wherein like elements are designated by like numerals, and wherein.

DETAILED DESCRIPTION

Figure 1:
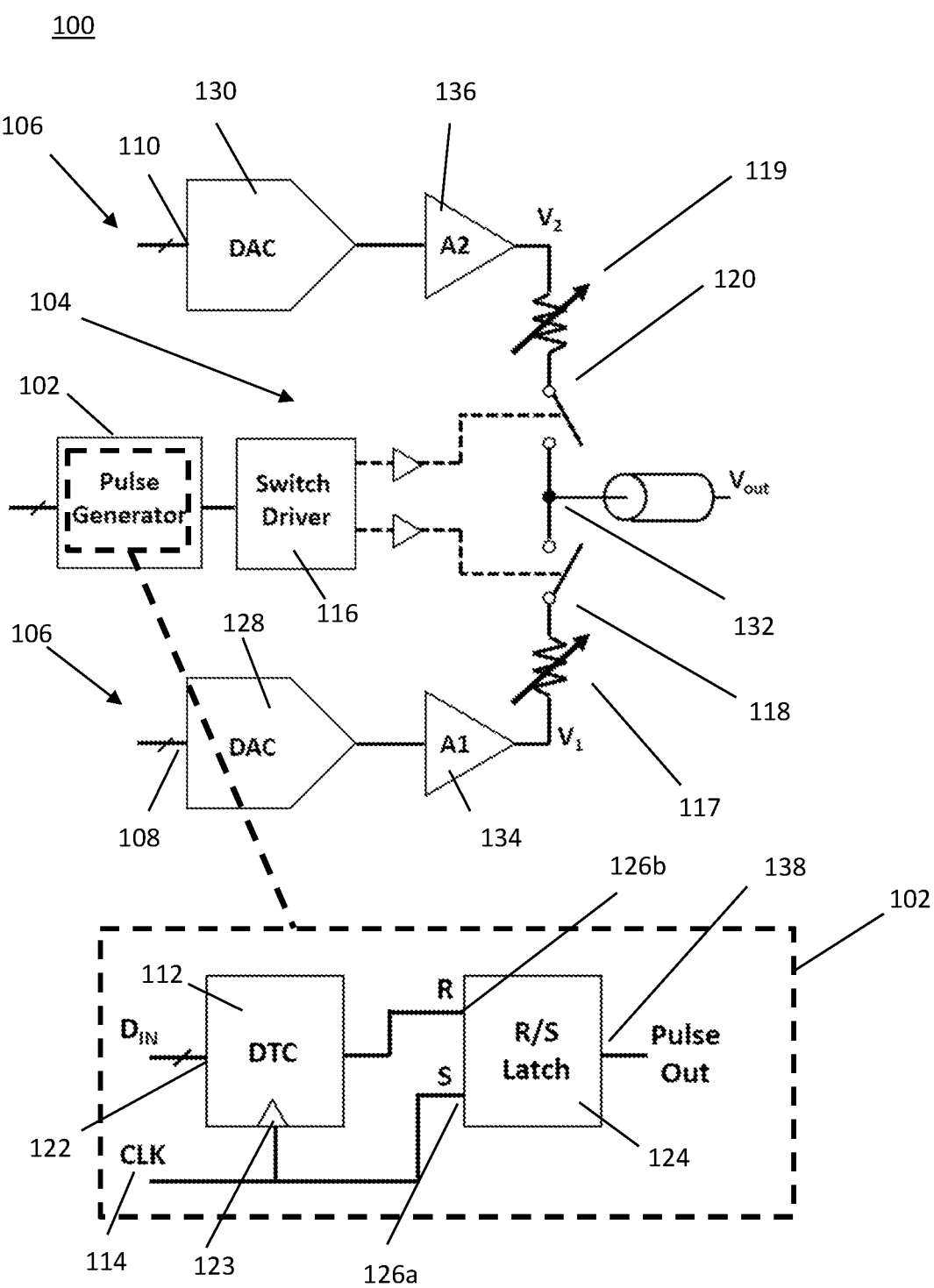
FIG. 1 is an exemplary circuit topology for an embodiment of a waveform processing device.
Figure 2:
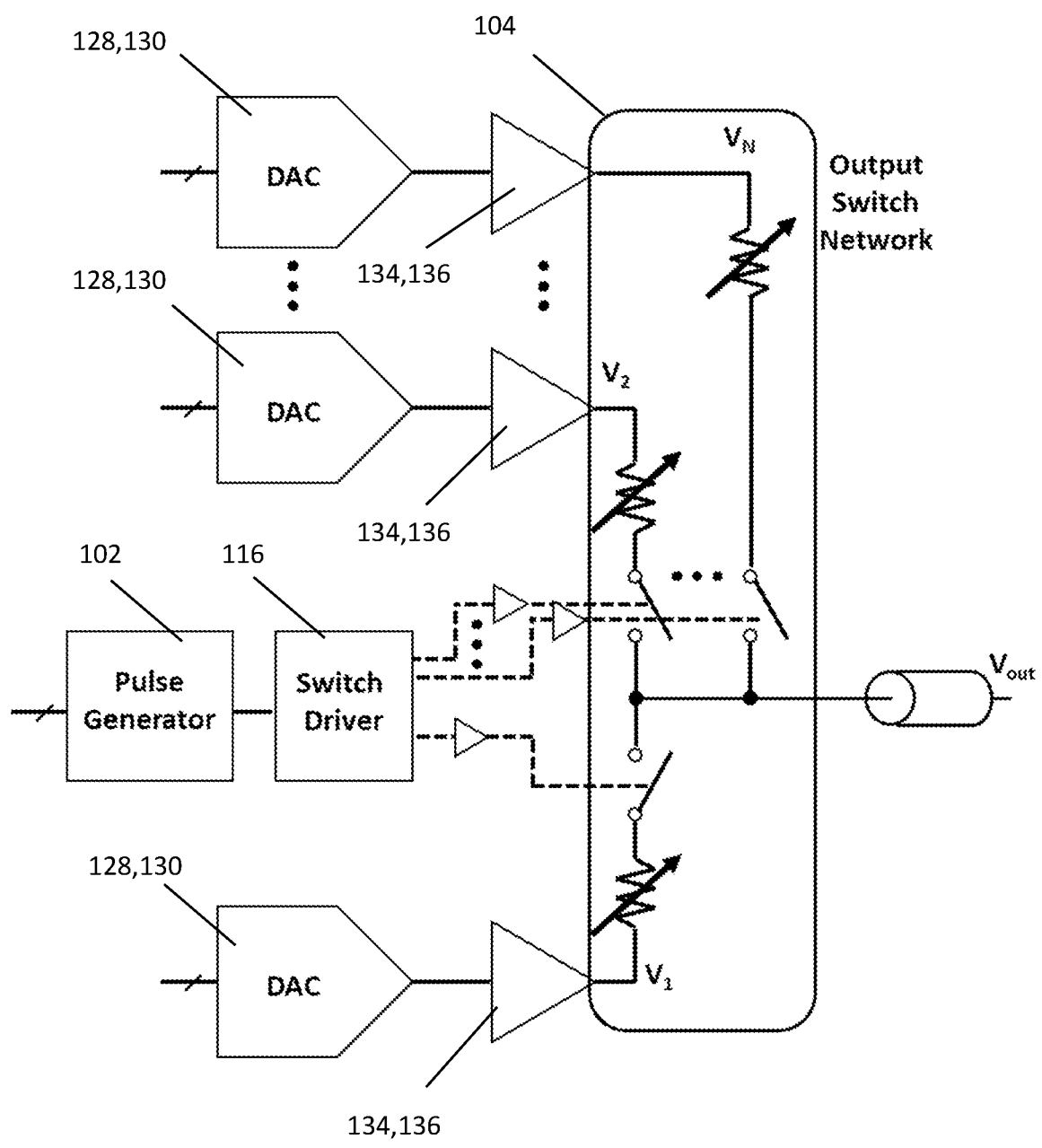
FIG. 2 is an exemplary circuit topology for an embodiment of a waveform processing device supporting additional voltage levels.

Referring to FIGS. 1 and 2, embodiments relate to a waveform processing device 100 (which may be referred to as a waveform processing circuit or as an architecture). The device 100 can be configured to receive and process one or more signals. The signal can be a time-varying voltage, current, or electromagnetic wave that carries information (e.g., a telecommunication signal, command signal, control signal, measurement signal, etc.). Each signal can be represented by a waveform as a function of time. Embodiments of the device 100 can be configured to synchronize signals received, which can involve synchronizing waveforms of the signals. Synchronization of signals allows for coordinated or orchestrated data processing, execution of logic operations, data transfer, etc. Synchronization of signals can also be done to allow processing systems that are located at differentiated distances from a signal source or that are moving at different speeds relative to a signal source to be in sync when performing their intended functions.

The device 100, or any component thereof, can be a circuit, a processing module, or a combination thereof. The circuit can include electronic and/or photonic devices (e.g., resistors, capacitors, inductors, transistors, diodes, amplifiers, inverters, converters, etc.) that, when in connection via a certain arrangement, can act upon the signal. The processing module can include a processor and memory, the memory having instructions stored thereon that cause the processor to perform circuit-like functions. Any of the processors disclosed herein can be part of or in communication with a machine (e.g., a computer device, a logic device, a circuit, an operating module (hardware, software, and/or firmware), etc.). The processor can be hardware (e.g., processor, integrated circuit, central processing unit, microprocessor, core processor, computer device, etc.), firmware, software, etc. configured to perform operations by execution of instructions embodied in computer program code, algorithms, program logic, control, logic, data processing program logic, artificial intelligence programming, machine learning programming, artificial neural network programming, automated reasoning programming, etc. The processor can receive, process, and/or store data related to a signal.

Any of the processors disclosed herein can be a scalable processor, a parallelizable processor, a multi-thread processing processor, etc. The processor can be, or be part of, a computer in which the processing power is selected as a function of anticipated network traffic (e.g., data flow). The processor can include any integrated circuit or other electronic device (or collection of devices) capable of performing an operation on at least one instruction, which can include a Reduced Instruction Set Core (RISC) processor, a CISC microprocessor, a Microcontroller Unit (MCU), a CISC-based Central Processing Unit (CPU), a Digital Signal Processor (DSP), a Graphics Processing Unit (GPU), a Field Programmable Gate Array (FPGA), etc. The hardware of such devices may be integrated onto a single substrate (e.g., silicon "die"), or distributed among two or more substrates. Various functional aspects of the processor may be implemented solely as software or firmware associated with the processor.

The processor can include one or more processing or operating modules. A processing or operating module can be a software or firmware operating module configured to implement any of the functions disclosed herein. The processing or operating module can be embodied as software and stored in memory, wherein the memory is operatively associated with the processor. A processing or operating module can be embodied as a web application, a desktop application, a console application, etc.

The processor can include or be associated with a computer or machine readable medium. The computer or machine readable medium can include memory. Any of the memory discussed herein can be computer readable memory configured to store data. The memory can include a volatile or non-volatile, transitory or non-transitory memory, and be embodied as an in-memory, an active memory, a cloud memory, etc. Examples of memory can include flash memory, Random Access Memory (RAM), Read Only Memory (ROM), Programmable Read only Memory (PROM), Erasable Programmable Read only Memory (EPROM), Electronically Erasable Programmable Read only Memory (EEPROM), FLASH-EPROM, Compact Disc (CD)-ROM, Digital Optical Disc DVD, optical storage, optical medium, a carrier wave, magnetic cassettes, magnetic tape, magnetic disk storage or other magnetic storage devices, or any other medium which can be used to store the desired information and which can accessed by the processor.

The memory can be a non-transitory computer-readable medium. The term "computer-readable medium" (or "machine-readable medium") as used herein is an extensible term that refers to any medium or any memory, that participates in providing instructions to the processor for execution, or any mechanism for storing or transmitting information in a form readable by a machine (e.g., a computer). Such a medium may store computer-executable instructions to be executed by a processing element and/or control logic, and data which is manipulated by a processing element and/or control logic, and may take many forms, including but not limited to, non-volatile medium, volatile medium, transmission media, etc. The computer or machine readable medium can be configured to store one or more instructions thereon. The instructions can be in the form of algorithms, program logic, etc. that cause the processor to execute any of the functions disclosed herein.

Embodiments of the memory can include a processor module and other circuitry to allow for the transfer of data to and from the memory, which can include to and from other components of a communication system. This transfer can be via hardwire or wireless transmission. The communication system can include transceivers, which can be used in combination with switches, receivers, transmitters, routers, gateways, wave-guides, etc. to facilitate communications via a communication approach or protocol for controlled and coordinated signal transmission and processing to any other component or combination of components of the communication system. The transmission can be via a communication link. The communication link can be electronic-based, optical-based, opto-electronic-based, quantum-based, etc. Communications can be via Bluetooth, near field communications, cellular communications, telemetry communications, Internet communications, etc.

Transmission of data and signals can be via transmission media. Transmission media can include coaxial cables, copper wire, fiber optics, etc. Transmission media can also take the form of acoustic or light waves, such as those generated during radio-wave and infrared data communications, or other form of propagated signals (e.g., carrier waves, digital signals, etc.).

Any of the processors can be in communication with other processors of other components. For instance, a processor of the pulse generator 102 can be in communication with a processor of the switching network 104. In some embodiments, the device 100 has a processor that is configured to coordinate functions of the components, transmit and receive command or control signals from other processors, etc. In some embodiments, the device 100 can include a processor that is a controller, wherein the controller is in communication with a component (e.g., pulse generator 102, switching network 104, etc.) of the device 100. The controller can be part of the device 100 or separate from the device 100 but be in communication with the device 100 (e.g., in communication with one or more components of the device 100). The controller can control and coordinate functions of the pulse generator 102 and/or the switching network 104. This can be via program logic, artificial intelligence, machine learning, automated reasoning, etc.

Any of the processors can have transceivers or other communication devices/circuitry to facilitate transmission and reception of wireless signals. Any of the processors can include an Application Programming Interface (API) as a software intermediary that allows two or more applications to talk to each other—e.g., use of an API can allow software of one processor to communicate with software of another processor.

The device 100 can include a channel 106. The channel 106 can include a first waveform input node 108 configured to receive a first signal having a first waveform. The channel 106 can include a second waveform input node 110 configured to receive a second signal having a second waveform. The first signal and/or first waveform can be the same as or different from the second signal and/or second waveform. The channel 106 is configured to receive the signal or signals for further signal processing. For instance, the channel 106 can include one or more receivers located at, or being part of, the input nodes 108, 110 configured to accept one or more signals from a transmission medium. As a non-limiting example, the receiver can be a circuit configured to decode the signal(s) or process the signal(s) to facilitate driving logical circuitry.

The device 100 can include a pulse generator 102. The pulse generator 102 can be a device configured to generate a pulsed output, such as an electrical pulse (e.g., voltage or current) or optical pulse. The pulse can be used to drive a component (e.g., a switch). The pulse generator 102 includes a power source to generate the voltage, current, or photonic pulse. The pulse generator 102 can include other controls to influence pulse amplitude, pulse intensity, pulse repetition rates or pulse repetition intervals, pulse width (duration), pulse delay, rise time, fall time, etc. Pulse generation and control can be via a digital technique, an analog technique, or a combination of both.

The pulse generator 102 can include a self-timed digital time converter (DTC) 112 with a clock generator (CLK) 114. The CLK 114 is dedicated to the self-timed DTC 112—e.g., the CLK 114 signals the start and/or end of a time period (e.g., provides a logic beat) for the self-timed DTC 112. The CLK 114 may or may not provide a logic beat for other components, but the primary function is to provide a logic beat for the DTC 112—any logic beat provided to other components is a secondary or ancillary function. The CLK 114 can be an oscillator circuit that produces oscillating high and low states to coordinate actions. The high/low states can be provided for via a square wave for example; however, other waveforms can be used. An embodiment of a CLK 114 can include an RC circuit with an amplifier, for example. More complex structures for the CLK 114 can be used.

The device 100 can include a switching network 104. The switching network 104 can be configured to be driven by an output from the pulse generator 102. This can be done to modulate signals received by the channel 106 in synchronization. For instance, the switching network 104 can include a switch 118, 120 that selectively switches an output of the first and second waveform input nodes 108, 110 to an output ($V_{out}$) of the device 100. This switching is driven by the pulse generator 102 output, and in particular the pulse repetition interval (PRI) of the pulsed output of the pulse generator 102 which is defined by the DTC 112.

As noted herein, the self-timed DTC 112 can have a CLK 114 that is dedicated to the self-timed DTC 112. Two or more components of the device 100 can be formed on a single substrate. Alternatively, one component of the device 100 can be formed on a first substrate and another component of the device 100 can be formed on a second substrate.

For instance, in some embodiments, the CLK 114 and the self-timed DTC 112 are formed on a single substrate. In some embodiments, the CLK 114 is formed on a first substrate and the self-timed DTC 112 is formed on a second substrate, the first substrate being different from the second substrate—e.g., the CLK 114 and the self-timed DTC 112 are distributed among two or more substrates. In either case, the CLK 114 operates to provide a logic beat to the self-timed DTC 112. In this regard, the device 100 is not constrained to a global clock. In other words, while the system may include a global clock to provide a logic beat for other functions, the self-timed DTC 112 has a dedicated CLK 114.

The device 100 can include plural self-timed DTCs 112. Each individual self-timed DTC 112 of the plural self-timed DTCs 112 can be connected to a single CLK 114. Thus, an individual CLK 114 provides a logic beat to an individual self-timed DTC 112—e.g., there is a CLK 114 for every self-timed DTC 112. In the alternative, more than one self-timed DTC 112 of the plural self-timed DTCs 112 can be connected to a single CLK 114. Thus, an individual CLK 114 provides a logic beat to more than one self-timed DTC 112.

While it is contemplated for the pulse generator 102 to generate a pulse output with a waveform that is a square wave, the waveform of the pulse output can be one or more of a sine, a triangle, a square, a sawtooth, etc.

As can be appreciated, the self-timed DTC 112 is configured to define a pulse width and a pulse repetition interval (PRI) of one or more pulses from the pulse generator 102. An electrical or optical input is provided to the self-timed DTC 112 at input 122 (denoted as DIN in the FIGS.). The CLK provides the logic beat to the self-timed DTC 112 at input 123 which allows the self-timed DTC 112 to define a pulse width and a PRI for the stream of pulses that will be generated.

With the switching network 104 connected to the pulse generator 102 so as to be driven by the output from the pulse generator 102, the switching network 104 can set an update rate and/or a switching speed based on the PRI. As the switching network 104 is in connection with the channel 106, signals received by the channel 106 can be modulated in synchronization based on the update rate and/or switching speed.

Figure 3:
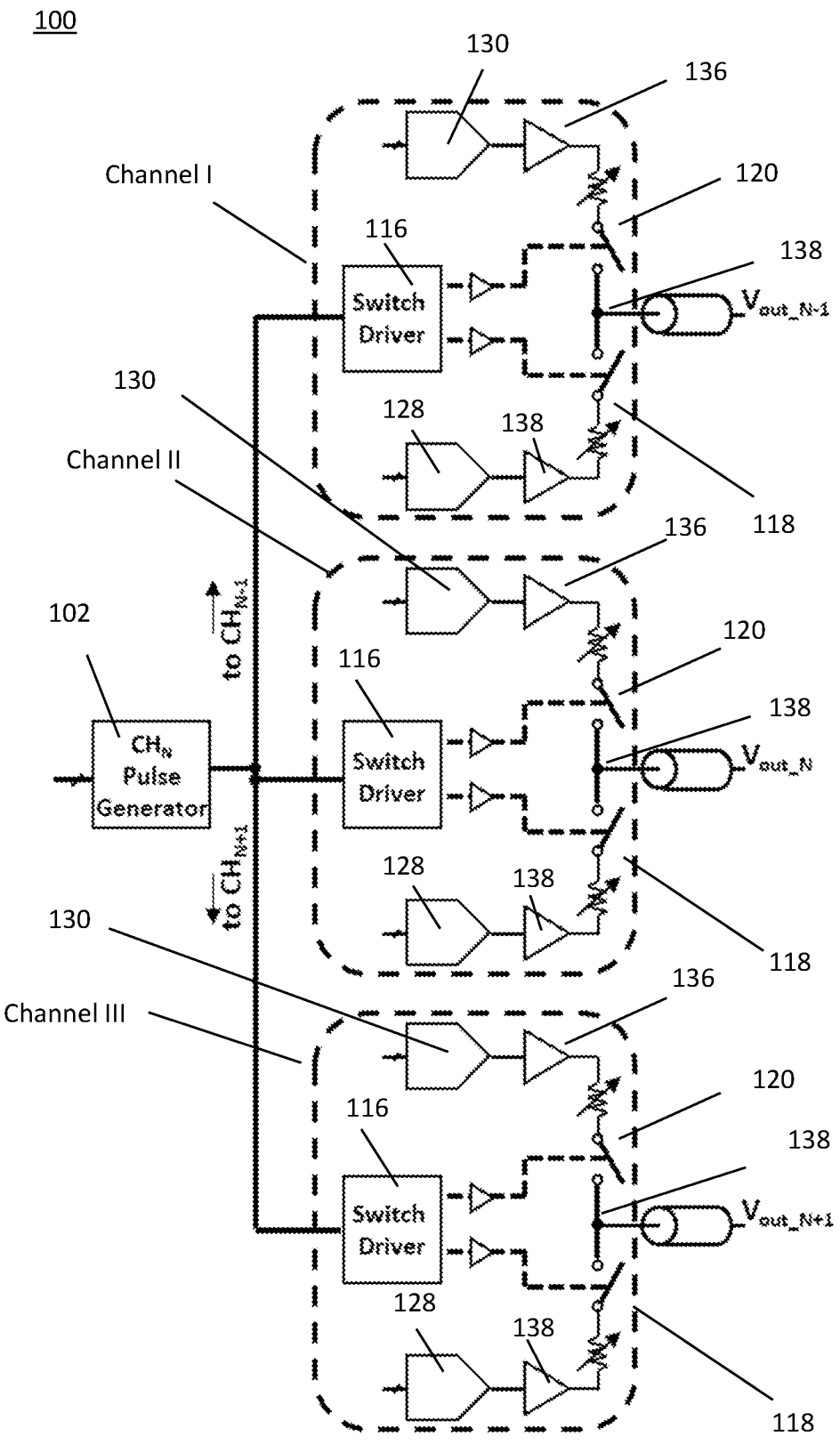
FIG. 3 is an exemplary circuit topology for an embodiment of a waveform processing device having a group of three channels sharing a common pulse generator.

Referring to FIG. 3, embodiments of the device 100 can include plural switching networks 104. Each switching network 104 of the plural switching networks 104 can be configured to receive an output from the pulse generator 102 and modulate waveforms from one or more channels 106. For instance, a single pulse generator 102 generates an output that is delivered to every switching network 104 of the plural switching networks 104. This can be done to provide a fixed pulse-width for all of the channels 106—e.g., each channel 106 operates on the same pulse-width. The term "fixed" means to have a same pulse-width for each channel 106, rather than meaning a constant. For instance, while each channel 106 has the same pulse-width, that pulse-width can be modulated or varied. In the exemplary embodiment shown in FIG. 3, the device 100 includes a pulse generator 102 having a self-timed DTC 112 with a CLK 114. The device 100 includes a group of three channels 106 and switching networks 104. FIG. 3 shows Channel I, Channel II, and Channel III. The group of three channels depicted in FIG. 3 share a common pulse generator 102. Each channel of the group includes a first waveform input node 108 configured to receive a first signal having a first waveform and a second waveform input node 110 configured to receive a second signal having a second waveform. Each channel includes a switching network 104 configured to be driven by an output from the pulse generator 102 to modulate signals received by the channel in synchronization. Each channel's switching network 104 receives the output from the single pulse generator 102. It is understood that more or less channels can be used.

Figure 4:
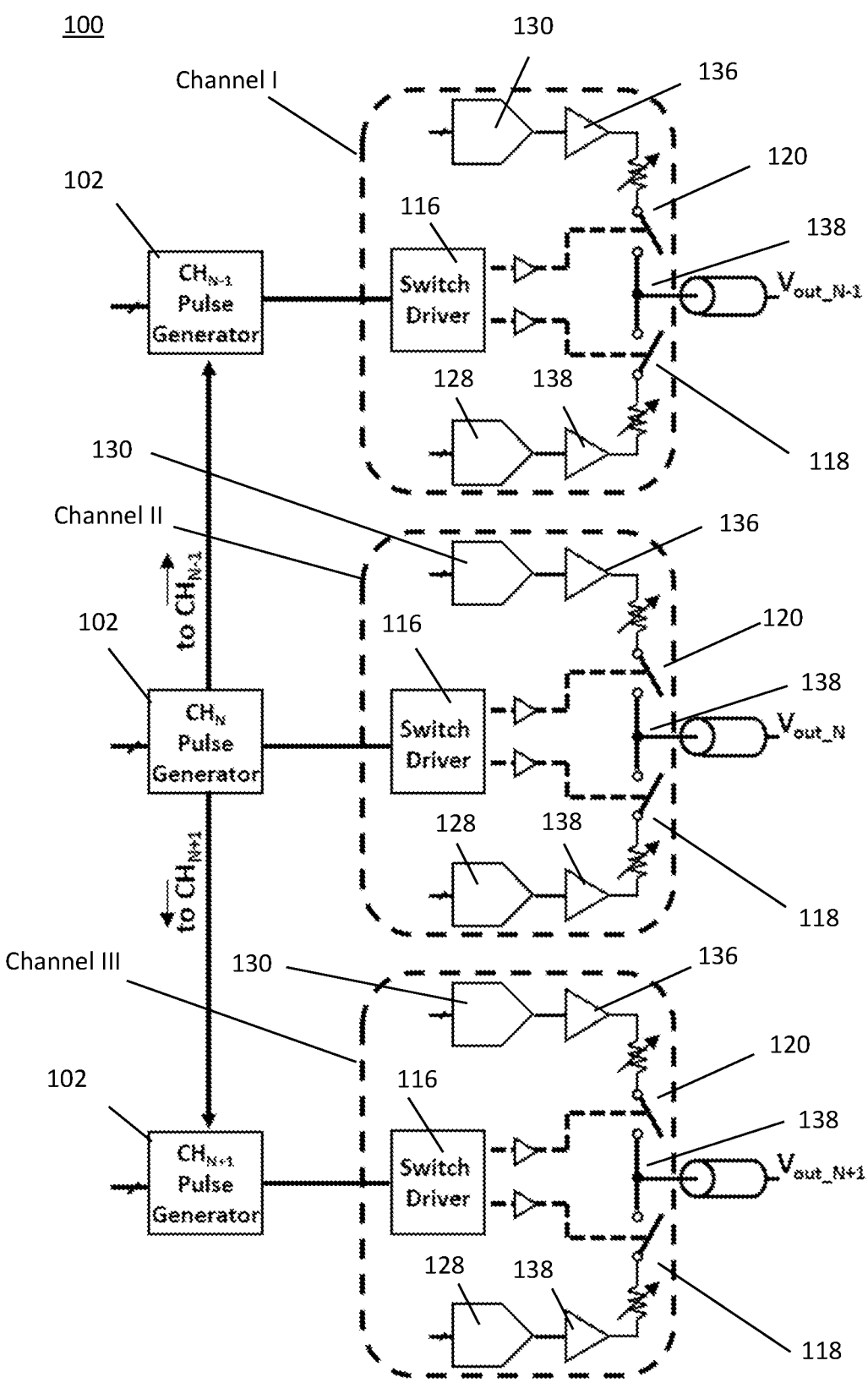
FIG. 4 is an exemplary circuit topology for an embodiment of a waveform processing device having a group of three channels, each channel receiving an output from an individual pulse generator.

Referring to FIG. 4, embodiments of the device 100 can include plural pulse generators 102 and plural switching networks 104. Each individual switching network 104 of the plural switching networks 104 is configured to receive an output from an individual pulse generator 102 of the plural pulse generators 102 and modulate signals received from one or more channels 106. For instance, an individual pulse generator 102 is dedicated to an individual switching network 104. This can be done to provide different pulse-widths for different channels 106—e.g., pulse generator 102 I can generate a pulse-width I for channel 106 I, pulse generator 102 II can generate a pulse-width II for channel 106 II, etc. Synchronization can be achieved by synchronizing the time of pulse origination. In the exemplary embodiment shown in FIG. 4, the device 100 includes three pulse generators 102 (I, II, III), each having a self-timed DTC 112 with a CLK 114. The device 100 includes a group of three channels 106 and switching networks 104. FIG. 4 shows Channel I, Channel II, and Channel III. Each channel of the group includes a first waveform input node 108 configured to receive a first signal having a first waveform and a second waveform input node 110 configured to receive a second signal having a second waveform. Each channel includes a switching network 104 configured to be driven by an output from a pulse generator 102 to modulate signals received by its channel 106 in synchronization. Channel I switching network 104 receives the output from pulse generator 102 I, Channel II switching network 104 receives the output from pulse generator 102 II, and Channel III switching network 104 receives the output from pulse generator 102 III. It is understood that more or less channels can be used.

Figure 5:
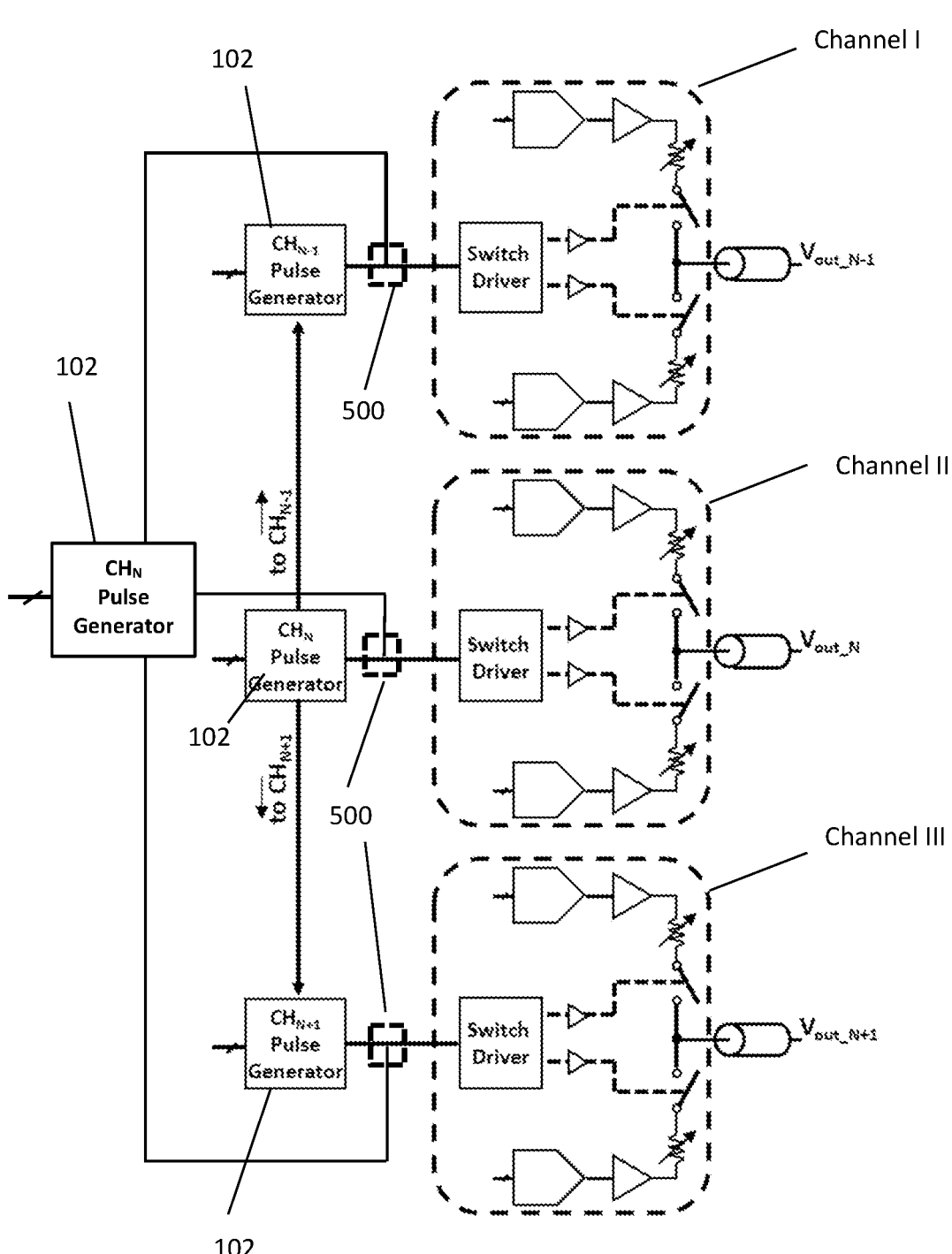
FIG. 5 is an exemplary circuit topology for an embodiment of a waveform processing device having a group of three channels, wherein the device can be toggled between providing a fixed pulse-width (e.g., the three channels sharing a common pulse generator) and different pulse-widths (e.g., each channel receives an output from an individual pulse generator).

Referring to FIG. 5, the device 100 can include a configuration having one or more arrangements shown in FIGS. 3 and 4. In addition, the device can include a configuration having a combination of arrangements shown in FIGS. 3 and 4. For instance, FIG. 5 shows the device 100 including a combination of FIG. 3 and FIG. 4 arrangements with a switching assembly 500 configured to switch between operation I and operation II. Operation I can be a fourth pulse generator 102 providing a fixed pulse-width to one or more channels, similar to the operation of FIG. 3. Operation II can be the operation described in FIG. 4 by excluding the fourth pulse generator 102 from being able to provide an input. Thus, the device 100 can be toggled between operation I and operation II.

Referring back to FIG. 1, a more detailed description of the components and arrangement thereof of the exemplary embodiment will be discussed.

The device 100 of FIG. 1 includes a channel 106. The channel 106 includes a first waveform input node 108 configured to receive a first signal having a first waveform. The first waveform input node 108 includes a first digital to analog converter (DAC) 128 configured to generate a voltage $V_1$ based on the first signal. The channel 106 includes a second waveform input node 110 configured to receive a second signal having a second waveform. The second waveform input node 110 includes a second DAC 130 configured to generate a voltage $V_2$ based on the second signal.

Exemplary embodiments depicted in the figures include DACs 128, 130. Each signal/waveform presented to inputs 108, 110 in these embodiments is a time-varying number represented by some number of bits. Each DAC 128, 130 then converts that number to a time-varying voltage—$V_1$ in the case of DAC 128 and $V_2$ in the case of DAC 130. It will be understood by one skilled in the art and from the benefit of the present disclosure that some embodiments can omit the DACs 128, 130. For instance, DACs can be omitted for embodiments in which the signals/waveforms are already analog.

The device 100 includes a pulse generator 102 including a self-timed DTC 112 with a CLK 114 and a reset/set (R/S) latch 124. The device 100 includes a switching network 104 including a switch driver 116, a first switch 118 connected to an output of the DAC 128 of the first waveform input node 108, and a second switch 120 connected to an output of the DAC 130 of the second waveform input node 110. The switching network 104 is configured to be driven by an output from the pulse generator 102 to modulate signals received by the channel 106 in synchronization. The switching can be optimized for low switching transients so as to avoid glitches during the rise/fall time of the pulse. Optimization techniques can involve: 1) filtering; 2) controlling the amplitude and transition time of the switch driver 116 waveforms; 3) employing symmetric switch configurations to achieve partial cancellation of feedthrough components from the switch driver 116, etc.

Other pulse generator 102 implementations can be used. As a non-limiting example, instead of having the R/S latch 124, two output timing channels (e.g., a START channel and a STOP channel) can be used, which can allow the switch driver 116 to accomplish the desired timing.

The CLK 114 is connected to an input 122 of the self-timed DTC 112 and to a set-input 126a of the R/S latch 124. The self-timed DTC 112 is connected to a reset-input 126b of the R/S latch 124. The first DAC 128 is connected to the first switch 118. The second DAC 130 is connected to the second switch 120. The switch driver 116 is connected to the first switch 118 and to the second switch 120. The switch driver 116 is configured to selectively connect the first DAC 128 and the second DAC 130 to an output node 132 of the device 100.

In some embodiments, the first DAC 128 is connected to a first buffer 134, and the second DAC 130 is connected to a second buffer 136. The first and/or second buffers 134,136 can be buffer amplifiers configured to isolate an input from an output. In this embodiment, the CLK 114 is connected to an input 122 of the self-timed DTC 112 and to a set-input 126a of the R/S latch 124. The self-timed DTC 112 is connected to a reset-input 126b of the R/S latch 124. The switch driver 116 is connected to an output 138 of the R/S latch 124. The first DAC 128 is connected to a first buffer 134 and the first buffer 134 is connected to the first switch 118. The second DAC 130 is connected to a second buffer 136 and the second buffer 136 is connected to the second switch 120. The switch driver 116 is connected to the first switch 118 and to the second switch 120, and the switch driver 116 is configured to selectively connect the first buffer 134 and the second buffer 136 to an output node 132 of the device 100.

The details of the components an arrangement thereof discussed above for FIG. 1 can be similarly applied to other embodiments discussed herein. For instance, the device 100, with the detailed discussed above, can include plural switching networks 104, each switching network 104 of the plural switching networks 104 configured to receive an output from the pulse generator 102 and modulate waveforms from one or more channels 106. The device 100, with the details discussed above, can include plural pulse generators 102 and plural switching networks 104. An individual switching network 104 of the plural switching networks 104 can be configured to receive an output from an individual pulse generator 102 of the plural pulse generators 102 and modulate signals received from one or more channels 106.

Embodiments can relate to a method for synchronizing waveforms. The method can involve receiving plural signals at a channel 106 of a waveform processing circuit 100. Each signal has a waveform. The waveform processing circuit 100 can include a pulse generator 102 having a self-timed DTC 112 with a CLK 114. The waveform processing circuit 100 can include a switching network 104 connected to the pulse generator 102. The method can involve driving the switching network 104 by an output of the pulse generator 102 to modulate signals received by the channel 106 in synchronization.

The channel 106 can include a first waveform input node 108 configured to receive a first signal having a first waveform. The first waveform input node 108 can include a first DAC 128 configured to generate a voltage $V_1$ based on the first signal. The channel 106 can include a second waveform input node 110 configured to receive a second signal having a second waveform. The second waveform input node 110 can include a second DAC 130 configured to generate a voltage $V_2$ based on the second signal. The method can involve generating a voltage $V_{out}$ by switching the $V_1$ and the $V_2$ to an output 138 of the switching network 104 to modulate signals received by the channel 106 in synchronization.

The method can involve generating a pulse output from the pulse generator 102 and defining, via the self-timed DTC 112, a pulse repetition interval (PRI) for a pulse output generated by the pulse generator 102.

As can be appreciated from the disclosure herein, embodiments describe an architecture 100 that can generate arbitrary waveforms with a high number of synchronized channels 106. This can be done while simultaneously exceeding the voltage and timing precision of existing implementations. One of the novel aspects of the architecture 100 and methods making and using the same is that timing precision can be decoupled from the update rate of the system by the introduction of a precision DTC 112. Embodiments provide for combining high precision voltage DACs 128,130 through a switching network 104 controlled by the DTC 112 to enable the synthesis of arbitrary pulse waveforms that exhibit a high precision in voltage and timing simultaneously. The problem of synchronization among a group of channels plagued by prior art can be addressed by the use of timing signals that are not constrained by the global system clock. One of the ways embodiments of the inventive architecture 100 alleviate problems plaguing existing system is by decoupling the update rate of the system from the timing precision. With the inventive architecture 100, the update rate can be set by the application (e.g., the pulse repetition interval/PRI) which may be slower than the required timing resolution by orders of magnitude. Reducing the system update rate enables the use of higher resolution DACs 128,130 and lowers the power consumption of the digital controller. The memory size requirement is also reduced in turn. The resulting system achieves a higher performance and scales to a higher number of channels than existing implementations.

FIG. 1 illustrates an exemplary architecture for a single channel 106, wherein a single channel 106 supporting two voltage levels (e.g., input signals) is shown. In this figure, two precision voltages ($V_1$ and $V_2$) can be switched to the output ($V_{out}$) by means of a switching network 104 driving a controlled-impedance transmission line. A controlled-impedance transmission line can be achieve by placing a variable impedance 117, 119 between the buffers 134, 136 and the switches 118, 120. For instance, a variable impedance 117 can be connected to the output of buffer 134 and connected to switch 118. Another variable impedance 119 can be connected to the output of buffer 136 and connected to switch 120. The switching network 104 is actuated by a pulse generator 102 that uses a precision DTC 112 to define the pulse-width. Although the resolution of the DTC 112 may be high, the required switching speed and bandwidth of the switching network I 04 is related to the PRI of the system, not to the timing resolution. Similarly, the buffers 134, 136 that drive the switching network I 04 have settling time requirements commensurate with the PRI. The impedance presented by the switching network 104 in combination with the output impedance of the buffer amplifiers 134, 136 serves as a source termination to the output transmission line. The switch impedance can be tuned via the variable impedances 117, 119 to achieve a high-quality termination. Various schemes including switchable elements and/or continuously adjustable elements can be applicable.

The DACs 128, 130 in FIG. 1 achieve high precision in voltage, but have relaxed bandwidth to keep power dissipation low. It is usual for high precision DACs 128, 130 to employ calibration in order to overcome nonidealities such as nonlinearity due to component mismatch. In such a case, the required bandwidth of the DAC 128,130 may be dictated by the calibration scheme chosen. The buffers 134,136 that follow the DACs 128,130 need not exhibit a correspondingly high linearity as long as the combination of DAC 128,130 and buffer 134,136 can be calibrated. This fact alleviates the gain-bandwidth requirement of the buffer amplifier, and therefore reduces the power dissipation.

FIG. 1 also shows an exemplary pulse generator 102 configuration, which produces a digital logic level pulse output with a low-jitter and finely tunable pulse-width. The DTC 112 is triggered by a rising edge on CLK 114 and generates a rising edge on its output after a digitally controlled time. The R/S latch 124 forms a pulse with a controlled pulse-width in response to a rising edge on CLK 114. A high-resolution DTC 112 is triggered by the rising edge of the CLK 114 signal, and produces a corresponding rising edge on its output after a digitally controlled delay time. The rising edge of CLK 114 also sets the R/S latch 124, which is subsequently reset upon arrival of the DTC 112 output. In this way, the pulse generator 102 output produces an output pulse with a digitally tunable pulse-width. Because the pulse-width is set only by the DTC 112 and is not impacted by jitter or skew of the CLK 114, there are no severe requirements imposed on the design of the global system clock—an important consideration for high channel count. The DTC 112 can support an update rate equal to the system update rate, and achieve a resolution and jitter commensurate with the timing precision requirements of the system. As in the case of the DAC 128, 130, it is possible to apply calibration schemes to overcome DTC 112 nonidealities. It will be understood by those skilled in the art that other pulse generator implementations are also possible.

The scheme of FIG. 1 can be extended to more than two voltage levels (e.g., input signals) by the addition of a DAC 128,130, a buffer 134,136, and switch 118,120 for each additional voltage level (see FIG. 2 for example). There is a limit to the number of voltage levels that can be supported by this scheme, since the bandwidth of the switching network 104 degrades as additional switch 118,120 elements are connected. The routing of switch control waveforms and precision DAC 128,130 voltages to the switching network 104 can also become challenging as the number of supported levels increases.

The synchronization of multiple channels 106 presents a problem since the pulse edge times are not precisely linked to the global system clock-thus it is not possible to use the global clock to align multiple channels 106 in time. To solve this issue, the inventive architecture 100 can employ synchronization signals that can be routed between channels 106 to facilitate time-alignment. These synchronization signals can be coincident with the start of a pulse, or both the start and end of a pulse. This synchronization can be accomplished over a group of channels 106, as opposed to globally over all channels 106 (see FIGS. 3-5 for exemplary schemes).

In FIG. 3, the DTC 112 from one channel 106 drives its own output switches 118,120 as well as the output switches 118, 120 of one or more synchronized channels 106. FIG. 3 shows an exemplary architecture 100 to facilitate synchronization of multiple channels 106 for the case where pulse-width is fixed among synchronized channels 106. This scheme is useful for cases where it is desirable for a group of synchronized channels to have matched pulse-widths. In this scenario, it is possible to omit the DTC 112 from the synchronized channels 106, saving power, area, and reducing memory demand.

FIG. 4 shows another implementation where each channel 106 has a DTC 112 to control its own switches 118, 120, and it is the time of pulse origination that is synchronized among all channels 106. FIG. 4 shows an exemplary architecture 100 to facilitate synchronization of multiple channels 106 for the case where time of pulse origination is synchronized, but different pulse-widths are allowed. This case is useful when the actuation time for multiple channels 106 requires synchronization, but each channel 106 may have an arbitrary pulse-width. The synchronization signals can be distributed with low added jitter, although various techniques can be employed to calibrate timing skew and variation in these signals.

The inventive architecture 100 has advantages in the digital controller performance as well as reduced memory usage over existing architectures. As discussed previously, the decoupling of timing resolution from system clock rate can yield orders of magnitude reduction in global clock frequency for applications requiring high timing precision. To illustrate this point, consider the application of time-of-flight ranging. The achievable range resolution of such a system is related to the timing precision of the hardware through the wave propagation velocity (e.g., speed of light or sound). However, the PRI of such a system is many orders of magnitude longer than the range resolution.

Another advantage over known architectures relates to the ability of inventive architecture 100 to issue a pulse every clock cycle. In contrast, the analog bandwidth of a known DAC-based system is usually limited to one half of the DAC clock frequency. With the inventive architecture 100, however, because the digital controller clocks at the full update rate of the system, any reduction in the update rate translates into power savings for the digital controller. The benefit can be even more substantial for systems with high timing precision. By avoiding a very high operating frequency of the digital controller, reliance on the use of power and area-hungry digital techniques such as interleaving, multiplexing, and the use of high-speed logic styles such as current-mode logic (CML) can be reduced or eliminated. The memory requirements of the inventive architecture 100 are also low; the digital word length is related to the dynamic range of the DACs 128, 130 and DTCs 112, and the depth of memory is proportional to the clock frequency. Since the system update rate is relaxed, the required memory depth is reduced by the same factor.

As can be appreciated from the present disclosure, the device 100 and method of making and using the same can provide a switching network 104 that is able to quickly switch between two or more precision voltage levels to constitute a pulse waveform with high precision in voltage as well as timing. The voltage levels have low bandwidth compared with the rise/fall time of the pulse waveform. The low required bandwidth enables these voltage levels to be generated with high voltage precision while avoiding high power dissipation. The number of switches 118,120 can be as few as two, but can also be higher (e.g., 4 or 5 switches). The number of precision voltage levels available to the system is set by the number of switches 118,120, DACs 128, 130, and buffer amplifiers 134,136. One or more of the switches 118, 120 can be matched to a characteristic impedance (e.g., 50 ohms) in order to effect a source termination for a transmission line of the switching network 104. In addition, the switches 118,120 can be optimized for low switching transients so as to avoid glitches during the rise/fall time of the pulse.

The switching network 104 is controlled by a precision DTC 112 in order to provide precision control of pulse-width. The DTC 112 can be actuated by a global system clock (e.g., 100 MHz). In this case, the pulse repetition frequency (PRF) can be as high as $f_{CLK}$, whereas in existing systems, the PRF is limited to no higher than $f_{CLK}/2$. The timing jitter of the pulse-width is set only by the self-timed DTC 112 circuit, and does not suffer a jitter degradation by the global system clock. Therefore, the need to synthesize and distribute a low jitter global clock is avoided. This is a significant power savings over existing systems in which the DAC clock impacts the timing performance.

The inventive architecture 100 is scalable to multiple, synchronized channels 106. Further, the inventive architecture 100 has reduced requirements for input data bandwidth, since each pulse can be represented by a single digital word.

The inventive architecture 100 can facilitate variations in arrangement. In one implementation, a single pulse generator 102 can control the timing of its own channel 106 as well as one or more neighboring channels 106. This architecture 100 represents a lower hardware complexity for cases in which the pulse-width of all channels 106 in a group can be identical. In another implementation, each channel 106 is provided with a dedicated pulse generator 102, and only the time of actuation is synchronized over one or more channels 106. Embodiments of the architecture 100 enable each channel 106 within a synchronized group of channels 106 to have differing pulse-widths.

It will be understood that modifications to the embodiments disclosed herein can be made to meet a particular set of design criteria. For instance, any component of the device 100 can be any suitable number or type of each to meet a particular objective. Therefore, while certain exemplary embodiments of the device 100 and methods of making and using the same disclosed herein have been discussed and illustrated, it is to be distinctly understood that the invention is not limited thereto but can be otherwise variously embodied and practiced within the scope of the following claims.

It will be appreciated that some components, features, and/or configurations can be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein. Additionally, the disclosure of a range of values is a disclosure of every numerical value within that range, including the end points.

What is claimed is:

1. A waveform processing device, comprising:
a first input node configured to receive a first signal having a first time-varying waveform;
a second input node configured to receive a second signal having a second time-varying waveform;
a pulse generator including a self-timed digital converter (DTC) with a clock generator (CLK); and
a switching network configured to be driven by an output from the pulse generator to modulate the first signal and the second signal in synchronization.

2. The waveform processing device of claim 1, wherein:
all components of the device are formed on a single substrate; or
at least one component of the device is formed on a first substrate and at least one other component of the device is formed on a second substrate, the first substrate being different from the second substrate.

3. The waveform processing device of claim 1, comprising:
plural self-timed DTCs:
wherein:
each individual self-timed DTC of the plural self-timed DTCs is connected to a single CLK; or
more than one self-timed DTC of the plural DTCs is connected to a single CLK.

4. The waveform processing device of claim 1, wherein:
the pulse generator is configured to generate a pulse output with a waveform that is one or more of a sine, a triangle, a square, or a sawtooth.

5. The waveform processing device of claim 1, wherein:
the self-timed DTC is configured to define a pulse width of a pulse.

6. The waveform processing device of claim 1, wherein:
the self-timed DTC is configured to define a pulse repetition interval (PRI) for a pulse.

7. The waveform processing device of claim 6, wherein:
the switching network is configured to set an update rate based on the PRI.

8. The waveform processing device of claim 7, wherein:
the switching network is configured to set a switching speed based on the PRI.

9. The waveform processing device of claim 1, comprising:
plural switching networks, each switching network of the plural switching networks configured to receive an output from the pulse generator and modulate one or more of the first signal or the second signal.

10. The waveform processing device of claim 1, comprising:
plural pulse generators; and
plural switching networks, an individual switching network of the plural switching networks configured to receive an output from an individual pulse generator of the plural pulse generators and modulate one or more of the first signal or the second signal.

11. A waveform processing device, comprising:
a first input node configured to receive a first signal, wherein the first input node includes a first digital to analog converter (DAC) configured to generate a voltage $V_1$ based on the first signal; and
a second input node configured to receive a second signal, wherein the second input node includes a second DAC configured to generate a voltage $V_2$ based on the second signal;
a pulse generator including a self-timed digital time converter (DTC) with a clock generator (CLK) and a reset/set (R/S) latch; and
a switching network including a switch driver, a first switch connected to an output of the first DAC, and a second switch connected to an output of the second DAC, wherein the switching network is configured to be driven by an output from the pulse generator to modulate the first signal and the second signal in synchronization.

12. The waveform processing device of claim 11, wherein:
the CLK is connected to an input of the self-timed DTC and to a set-input of the R/S latch; and
the self-timed DTC is connected to a reset-input of the R/S latch.

13. The waveform processing device of claim 11, wherein:
the first DAC is connected to the first switch;
the second DAC is connected to the second switch; and
the switch driver is connected to the first switch and to the second switch, the switch driver being configured to selectively connect the first DAC and the second DAC to an output node.

14. The waveform processing device of claim 13, comprising:
a first buffer connected to the output of the first DAC, wherein an output of the first buffer is connected to the first switch; and
a second buffer connected to the output of the second DAC, wherein an output of the second buffer is connected to the second switch.

15. The waveform processing device of claim 11, wherein:
the CLK is connected to an input of the self-timed DTC and to a set-input of the R/S latch;
the self-timed DTC is connected to a reset-input of the R/S latch;
the switch driver is connected to an output of the R/S latch;
the first DAC is connected to a first buffer and the first buffer is connected to the first switch;
the second DAC is connected to a second buffer and the second buffer is connected to the second switch; and
the switch driver is connected to the first switch and to the second switch, the switch driver configured to selectively connect the first buffer and the second buffer to an output node.

16. The waveform processing device of claim 11, comprising:

plural switching networks, each switching network of the plural switching networks configured to receive an output from the pulse generator and modulate one or more of the first signal or the second signal.

17. The waveform processing device of claim 11, comprising:

plural pulse generators; and plural switching networks, an individual switching network of the plural switching networks configured to receive an output from an individual pulse generator of the plural pulse generators and modulate one or more of the first signal or the second signal.

18. A method for synchronizing waveforms, the method comprising:

receiving a first signal, having a first time-varying waveform, at a first input node of a waveform processing circuit and a second signal, having a second time-varying waveform, at a second input node of the waveform processing circuit, the waveform processing circuit including: a pulse generator with a self-timed digital time converter (DTC) with a clock generator (CLK); and a switching network connected to the pulse generator; and driving the switching network by an output of the pulse generator to modulate signals received by the waveform processing circuit in synchronization.

19. The method of claim 18, wherein the first input node includes a first digital to analog converter (DAC) configured to generate a voltage $V_1$ based on the first signal, wherein the second input node includes a second DAC configured to generate a voltage $V_2$ based on the second signal, the method comprising:

generating a voltage $V_{out}$ by switching the voltage $V_1$ and the voltage $V_2$ to an output of the switching network to modulate one or more of the first signal and the second signal in synchronization.

20. The method of claim 18, comprising:

generating a pulse output from the pulse generator, and defining, via the self-timed DTC, a pulse repetition interval (PRI) for a pulse output generated by the pulse generator.

* * * * *